United States Patent
Song

(10) Patent No.: US 7,184,354 B2
(45) Date of Patent: Feb. 27, 2007

(54) MEMORY DEVICE REDUCED POWER CONSUMPTION IN POWER DOWN MODE

(75) Inventor: Ho Uk Song, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 56 days.

(21) Appl. No.: 11/109,615

(22) Filed: Apr. 19, 2005

(65) Prior Publication Data

US 2006/0171231 A1    Aug. 3, 2006

(30) Foreign Application Priority Data

Jan. 31, 2005    (KR) .................... 10-2005-0008526

(51) Int. Cl.
G11C 5/14    (2006.01)
(52) U.S. Cl. .................... 365/229; 365/227; 365/228
(58) Field of Classification Search ................ 365/222, 365/227, 228, 229
See application file for complete search history.

(56) References Cited

U.S. PATENT DOCUMENTS

| | | | |
|---|---|---|---|
| 6,845,054 B2 * | 1/2005 | Lovett et al. | 365/227 |
| 6,931,479 B2 * | 8/2005 | Choi | 711/5 |
| 6,992,946 B2 * | 1/2006 | Ooishi | 365/226 |

* cited by examiner

Primary Examiner—Richard T. Elms
Assistant Examiner—Hien N Nguyen
(74) Attorney, Agent, or Firm—Ladas & Parry LLP

(57) ABSTRACT

A memory device capable of reducing power consumption when the operation mode is a deep power down mode, includes an external power source voltage line through which an external power source voltage is supplied; an internal voltage line through which an internal voltage generated in an internal voltage generator is supplied; a ground voltage line through which a ground voltage is supplied; and an internal circuit selectively connected to one of the external power source voltage line, the internal voltage line and the ground line according to the operation modes of the memory device, to use one of the external power source voltage, the internal voltage and the ground voltage as a power source based on the selective connection of the lines.

9 Claims, 2 Drawing Sheets

MEMORY DEVICE REDUCED POWER CONSUMPTION IN POWER DOWN MODE

BACKGROUND OF THE INVENTION

1. Field of the Invention

The present invention relates to a semiconductor device capable of reducing power consumption, and more particularly to a semiconductor memory device capable of reducing leakage currents at the time of a deep power down mode.

2. Description of the Prior Art

As generally known in the art, FIG. 1 is an internal circuit block diagram of a typical memory device of the prior art for explaining power consumption at the time of self-refresh mode.

In FIG. 1, one internal circuit 100 includes, for example, a circuit such as a data input/output section of the memory device consuming certain amount of electrical power even at the time of refresh mode. Another internal circuit 101 includes, for example, circuits such as a row path circuit and an internal address counter of the memory device, which become active at the time of the refresh mode. Specifically, the internal circuit 100 refers to a circuit which is not related with the self-refresh operation, whereas the internal circuit 101 refers to a circuit which is related with the self-refresh operation. In FIG. 1, an SRF (Self-Refresh Flag) signal becomes high level at the time of the self-refresh mode.

Referring to FIG. 1, when the self-refresh mode is on, the internal circuit 100 uses external power source voltage VDD as a power source, and the internal circuit 101 uses, as a power source, internal voltage VCORE of which level is lower than that of the external power source voltage VDD.

As mentioned above, when the operation of the conventional memory device is in the self-refresh mode, consumption currents IDD6 of the device can be reduced in the manner that the internal circuit uses as a power source, the internal voltage VCORE of which level is lower than that of the external power source voltage VDD.

However, in a deep power down mode (DPDM) where most of circuits of the memory device come into a disabled state except for only a minority part of all the circuits (for example, in the DPDM, the self-refresh flag signal SRF is at low level), the conventional memory devices have a problem in that electrical power energy of the external power source voltage VDD is consumed in vain, although it is not necessary to supply any power to the internal circuit 101.

SUMMARY OF THE INVENTION

Accordingly, the present invention has been made to solve the above-mentioned problems occurring in the prior art, and an object of the present invention is to provide a memory device capable of reducing power consumption by cutting a power applied to an internal circuit which is operated at the time of a deep power down mode or a self-refresh mode.

In order to accomplish this object, according to first aspect of the present invention, there is provided a memory device includes an internal circuit for using external power source voltage as a power source when an operation mode of the memory device is a normal mode, using internal voltage generated in an internal part of the memory device, as a power source when the operation mode of the memory device is a self-refresh mode, and using ground voltage as a power source when the operation mode of the memory device is a deep power down mode.

According to second aspect of the present invention, there is provided a memory device includes external power source voltage line through which external power source voltage is supplied; an internal voltage line through which internal voltage generated in an internal voltage generator is supplied; ground voltage line through which ground voltage is supplied; and an internal circuit selectively connected to one of the external power source voltage line, the internal voltage line and the ground line according to the operation modes of the memory device, to use one of the external power source voltage, the internal voltage and the ground voltage as a power source according to the selective connection of the lines.

In the memory device of the second aspect mentioned above, when the operation mode is a normal mode, the internal circuit uses the external power source voltage as a power source; when the operation mode is a self-refresh mode, the internal circuit uses the internal voltage as a power source; and when the operation mode is a deep power down mode, the internal circuit uses the ground voltage as a power source. Preferably, when the operation mode is the normal mode or the self-refresh mode, the internal voltage generator is in an enabled state; and when the operation mode is the deep power down mode, the internal voltage generator is in a disabled state.

Preferably, the memory device of the second aspect further comprises a controller for receiving a first mode signal and a second mode signal, the first mode signal indicating the self-refresh mode as an operation mode, and the second mode signal indicating the deep power down mode as an operation mode, wherein: when the first mode signal is enabled, the controller outputs a first switch signal for connecting the internal voltage to a driving voltage receiving section of the internal circuit; when the second mode signal is enabled, the controller outputs a second switch signal for connecting the ground voltage to the driving voltage receiving section of the internal circuit; and when both the first mode signal and the second mode signal are all disabled, the controller outputs a third switch signal for connecting the external power source voltage to the driving voltage receiving section of the internal circuit. More preferably, the memory device further comprises a first switch turned on or off in response to the first switch signal, and connected between the driving voltage receiving section of the internal circuit and the internal voltage line; a second switch turned on or off in response to the second switch signal, and connected between the driving voltage receiving section of the internal circuit and the ground voltage line; and a third switch turned on or off in response to the third switch signal, and connected between the driving voltage receiving section of the internal circuit and the external power source voltage line.

According to second aspect of the present invention, there is provided a memory device comprising; an external power source line, an internal power source line, a ground voltage line, a first internal circuit connected with the external power source line, a second internal circuit, and a switch connected between the ground voltage line and the second internal circuit. Wherein the switch is activating according to a deep power down signal. And wherein, the switch provides a ground voltage to the second internal circuit according to a deep power down signal.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
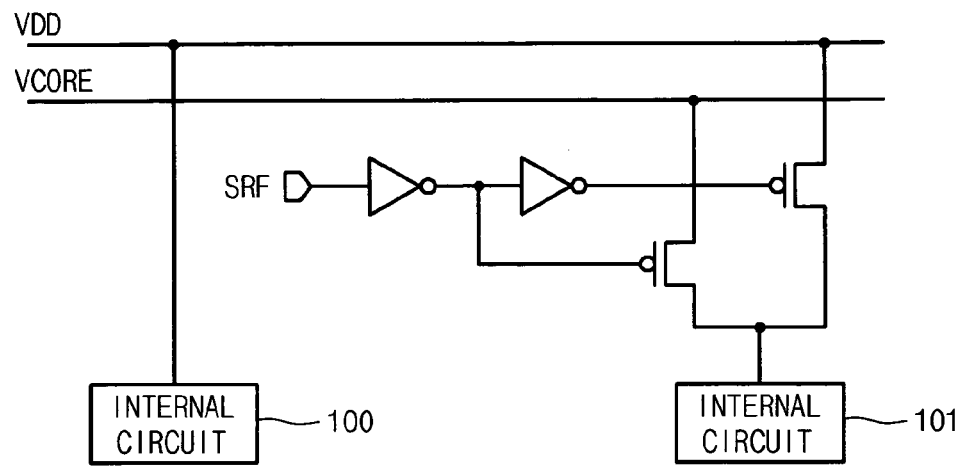
FIG. 1 is a circuit block diagram of a typical memory device of a prior art for illustrating power consumption at the time of a self-refresh mode.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2:
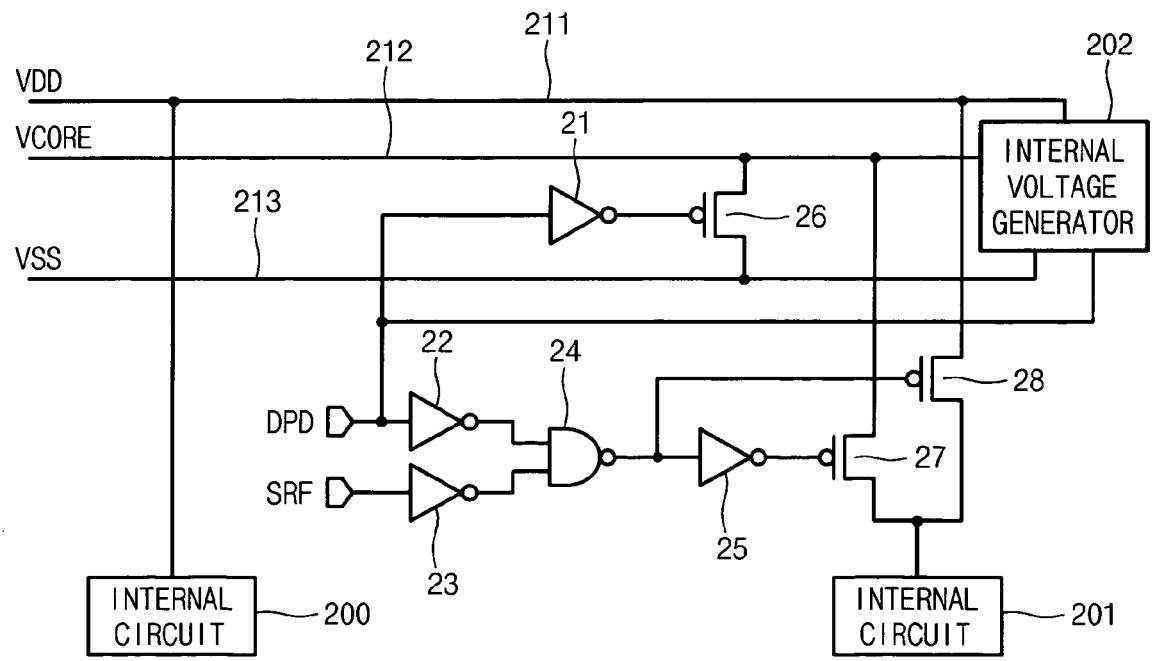
FIG. 2 illustrates a structure of a memory device according to a first embodiment of the present invention.

FIG. 2 illustrates a structure of a memory device according to a first embodiment of the present invention.

In the memory device shown in FIG. 2, an internal circuit 200 refers to a circuit for using external power source voltage as a driving voltage regardless of any operation modes of the memory device, whereas an internal circuit 201 refers to a circuit for selecting and using one of the external power source voltage VDD, internal voltage VCORE and ground voltage VSS, as a power source in accordance with the operation modes of the memory device. Also, referring to FIG. 2, an internal voltage generator 202 receives the external power source voltage VDD and the ground voltage VSS, and produces internal voltage VCORE used for internal parts of the memory device, based on the received voltages VDD and VSS.

In FIG. 2, a signal DPD is at a high level if an operation mode of the memory device is a deep power down mode (DPDM), and a signal SRF is at a high level if an operation mode of the memory device is a self-refresh mode.

Referring to FIG. 2, the signal DPD is applied to inverters 21 and 22, and the signal SRF is applied to an inverter 23. An output terminal of the inverter 21 is connected to a gate of a PMOS transistor 26 functioning as a switch. The PMOS transistor 26 is connected between an internal voltage line 212 and a ground voltage line 213. The signal DPD is also applied to the internal voltage generator 202 which is in a disabled state when the signal DPD is at a high level.

Both an output terminal of the inverter 22 and an output terminal of the inverter 23 are connected to an input terminal of a NAND gate 24. An output terminal of the NAND gate 24 is connected to an input terminal of an inverter 25.

An output terminal of the NAND gate 24 is connected to a gate of a PMOS transistor 28 functioning as a switch. The PMOS transistor 28 is connected between an external power source voltage line 211 and a driving voltage receiving section of the internal circuit 201.

An output terminal of the inverter 25 is connected to a gate of a PMOS transistor 27 functioning as a switch. The PMOS transistor 27 is connected between an internal voltage line 212 and the driving voltage receiving section of the internal circuit 201.

Hereinafter, a description will be made about how the voltages applied to the internal circuit 201 change according to the operation modes of the memory device shown in FIG. 2.

The operation modes of the present invention include a normal mode, a self-refresh mode and a deep power down mode (DPDM). For example, when the operation mode is the normal mode or the self-refresh mode, the internal voltage generator is turned on, whereas when the operation mode is the deep power down mode, the internal voltage generator is turned off.

Above all, in the normal mode, the signal DPD indicating the deep power down mode and the signal SRF indicating the self-refresh mode are all at low levels. In this case, the PMOS transistors 26 and 27 are turned off, the PMOS transistor 28 is turned on. Accordingly, the external power source voltage VDD is supplied to the driving voltage receiving section of the internal circuit 201.

Next, in the self-refresh mode, the signal DPD indicating the deep power down mode is at a low level, and the signal SRF indicating the self-refresh mode is at a high level. In this case, the PMOS transistors 26 and 28 are turned off, and the PMOS transistor 27 is turned on. Accordingly, the internal voltage VCORE is supplied to the driving voltage receiving section of the internal circuit 201.

Next, in the deep power down mode where the internal voltage generator 202 is turned off, the signal DPD indicating the deep power down mode is at a high level and the signal SRF indicating the self-refresh mode is at a low level. In this case, the PMOS transistor 28 is turned off, the PMOS transistor 26 and 27 are turned on. Since the PMOS transistor 26 is turned on, the potential level of the internal voltage line 212 is the same as that of the ground voltage VSS. Also, since the PMOS transistor 27 is turned on, the voltage applied to the driving voltage receiving section of the internal circuit 201 corresponds to the ground voltage VSS. Specifically, when the operation mode is the deep power down mode, the internal circuit 201 is disabled because the ground voltage is applied to the driving voltage receiving section of the internal circuit 201.

As mentioned above, when the operation mode of the memory device is the normal mode, the internal circuit 201 is driven with the external power source voltage, and when the operation mode of the memory device is the self-refresh mode, the internal circuit 201 is driven with the internal voltage VCORE. When the operation mode of the memory device is the deep power down mode, the internal circuit 201 is cut and not operated. Accordingly, in the deep power down mode, consumption power of the memory device can be reduced significantly.

Figure 3:
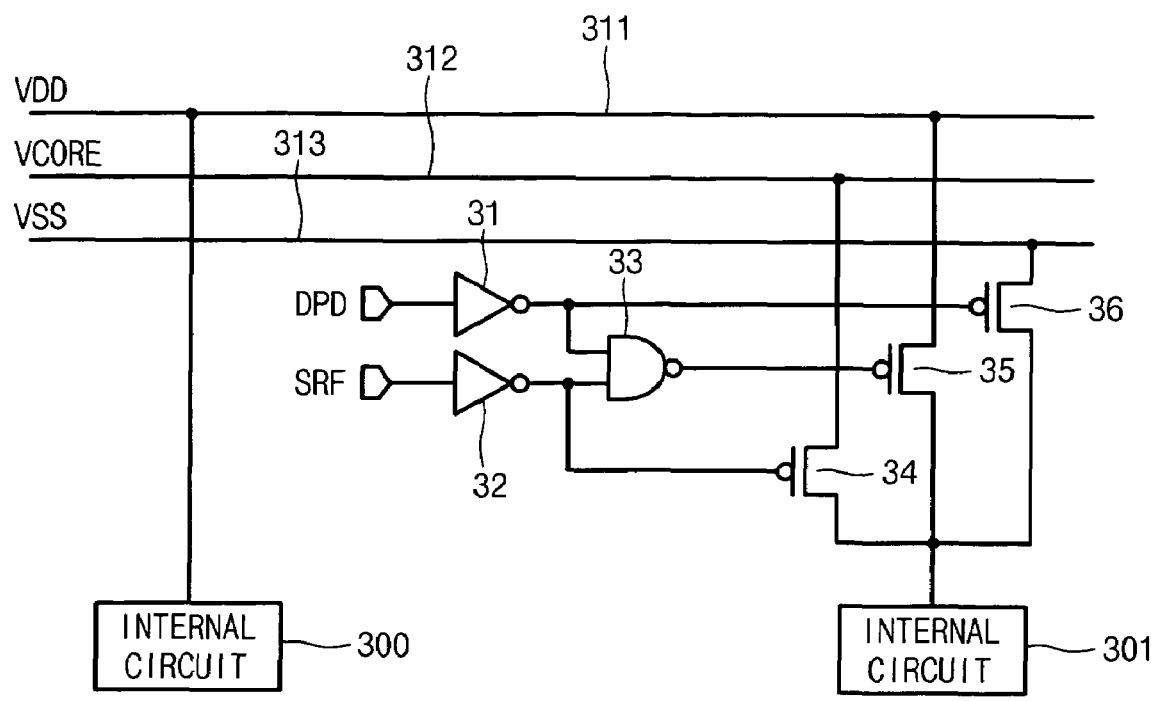
FIG. 3 illustrates a structure of a memory device according to a second embodiment of the present invention.

FIG. 3 illustrates a structure of a memory device according to a second embodiment of the present invention.

In the memory device of FIG. 3, an internal circuit 300 indicates a circuit for using external power source voltage as a driving voltage regardless of any operation modes of the memory device, whereas an internal circuit 301 indicates a circuit for selecting and using one of the external power source voltage VDD, internal voltage VCORE and ground voltage VSS, as a driving voltage in accordance with the operation modes of the memory device.

In FIG. 3, if the operation mode of the memory device is a deep power down mode (DPDM), a signal DPD is at a high level, and if the operation mode of the memory device is a self-refresh mode, a signal SRF is at a high level.

In the memory device 301 according to the second embodiment of the present invention, internal circuits 300 and 301 are similar to the internal circuits 200 and 201 of the first embodiment in structures thereof. Specifically, the internal circuit 300 is operated by the external power source voltage VDD regardless of the operation modes of the memory device, whereas the internal circuit 301 is operated only in the normal mode or the self-refresh mode. Especially in the normal mode, the internal circuit 301 uses the external power source voltage VDD as a driving voltage in order to stabilize operation thereof. Also, when the self-refresh operation is on, the internal circuit 301 uses the internal voltage VCORE as a driving voltage to reduce the power consumption of the memory device, significantly.

Hereinafter, a description will be made about how the voltages applied to the internal circuit 301 change according to the operation modes of the memory device shown in FIG. 3.

According to the second embodiment of the present invention, the operation modes of the memory device include a normal mode, a self-refresh mode and a deep power down mode (DPDM).

Above all, in the normal mode, the signal DPD indicating the deep power down mode and the signal SRF indicating the self-refresh mode are all at low levels. In this case, PMOS transistors 34 and 36 are turned off, a PMOS transistor 35 is turned on. Accordingly, the external power source voltage VDD is supplied to the driving voltage receiving section of the internal circuit 301.

Next, in the self-refresh mode, the signal DPD indicating the deep power down mode is at a low level, and the signal SRF indicating the self-refresh mode is at a high level. In this case, the PMOS transistors 35 and 36 are turned off, the PMOS transistor 34 is turned on. Accordingly, the internal voltage VCORE is supplied to the driving voltage receiving section of the internal circuit 301.

Next, in the deep power down mode, the signal DPD indicating the deep power down mode is at a high level and the signal SRF indicating the self-refresh mode is at a low level. In this case, the PMOS transistors 34 and 35 are turned off, the PMOS transistor 36 is turned on. Accordingly, the ground voltage VSS is supplied to the driving voltage receiving section of the internal circuit 301. Specifically, in the deep power down mode, the internal circuit 301 is disabled because the ground voltage is applied to the driving voltage receiving section of the internal circuit 301.

According to the second embodiment of the present invention, when the operation mode of the memory device is the normal mode, the internal circuit 301 is driven with the external power source voltage VDD, and when the operation mode is the self-refresh mode, the internal circuit 301 is driven with the internal voltage VCORE. Also, when the operation mode of the memory device is the deep power down mode, the internal circuit 301 is cut and not operated. Accordingly, in the deep power down mode, consumption power of the memory device can be reduced, significantly.

As mentioned above, the memory devices of the present invention includes the internal circuits 200 and 300 for using the external power source voltage VDD as a driving voltage regardless of the operation modes thereof, and the internal circuits 201 and 301 for using different driving voltages according to the operation modes to effectively reduce the power consumption of the memory device.

According to the present invention, it is possible to further reduce power consumption in the memory device. Especially in mobile memory devices, the principle of the present invention can be applied to them very effectively.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A memory device comprising:
an internal circuit for using external power source voltage as a power source when an operation mode of the memory device is a normal mode, using internal voltage generated in an internal part of the memory device, as a power source when the operation mode of the memory device is a self-refresh mode, and using ground voltage as a power source when the operation mode of the memory device is a deep power down mode.

2. A memory device comprising:
an external power source voltage line through which external power source voltage is supplied;
an internal voltage line through which internal voltage generated in an internal voltage generator is supplied;
a ground voltage line through which ground voltage is supplied; and
an internal circuit selectively connected to one of the external power source voltage line, the internal voltage line and the ground line according to the operation modes of the memory device, to use one of the external power source voltage, the internal voltage and the ground voltage as a power source according to the selective connection of the lines, wherein when the operation mode is a deep power down mode, the internal circuit uses the ground voltage as a power source.

3. The memory device as claimed in claim 2, wherein when the operation mode is a normal mode, the internal circuit uses the external power source voltage as a power source; when the operation mode is a self-refresh mode, the internal circuit uses the internal voltage as a power source.

4. The memory device as claimed in claim 3, wherein when the operation mode is the normal mode or the self-refresh mode, the internal voltage generator is in an enabled state; and when the operation mode is the deep power down mode, the internal voltage generator is in a disabled state.

5. The memory device as claimed in claim 2, further comprises a controller for receiving a first mode signal and a second mode signal, and the first mode signal indicating the self-refresh mode as an operation mode, and the second mode signal indicating the deep power down mode as an operation mode, wherein:
when the first mode signal is enabled, the controller outputs a first switch signal for connecting the internal voltage to a driving voltage receiving section of the internal circuit;
when the second mode signal is enabled, the controller outputs a second switch signal for connecting the ground voltage to the driving voltage receiving section of the internal circuit; and
when both the first mode signal and the second mode signal are all disabled, the controller outputs a third switch signal for connecting the external power source voltage to the driving voltage receiving section of the internal circuit.

6. The memory device as claimed in claim 5, wherein the memory device further comprises:
a first switch turned on or off in response to the first switch signal, and connected between the driving voltage receiving section of the internal circuit and the internal voltage line;
a second switch turned on or off in response to the second switch signal, and connected between the driving voltage receiving section of the internal circuit and the ground voltage line; and
a third switch turned on or off in response to the third switch signal, and connected between the driving voltage receiving section of the internal circuit and the external power source voltage line.

7. A memory device comprising;
an external power source line;
an internal power source line;
a ground voltage line;
a first internal circuit connected with the external power source line;
a switch connected to the external power source line, to the internal power source line and to the the ground voltage line; and
a second internal circuit connected to the switch, wherein the switch is adapted to selective control a connection between the second internal circuit and the ground voltage line and to selectively control a connection between the second internal circuit and the internal cower source line, and to selectively control a connection between the second internal circuit and the external power source line.

8. The memory device as claimed in claim 7, wherein the switch is activating according to a deep power down signal.

9. The memory device as claimed in claim 7, wherein the switch provides a ground voltage to the second internal circuit according to a deep power down signal.

* * * * *